United States Patent
Bhairi (10) Patent No.: US 8,330,342 B2
(45) Date of Patent: Dec. 11, 2012

(54) SPHERICAL LIGHT OUTPUT LED LENS AND HEAT SINK STEM SYSTEM

(76) Inventor: Malek Bhairi, Claremont, CA (US)

( * ) Notice: Subject to any disclaimer, the term of this patent is extended or adjusted under 35 U.S.C. 154(b) by 113 days.

(21) Appl. No.: 12/643,182

(22) Filed: Dec. 21, 2009

(65) Prior Publication Data

US 2011/0148270 A1 Jun. 23, 2011

(51) Int. Cl.
*H01J 5/16* (2006.01)
*F21V 5/00* (2006.01)

(52) U.S. Cl. .................. 313/116; 362/329; 362/800

(58) Field of Classification Search .......... 313/116; 257/E33.073; 362/329, 800; 359/743
See application file for complete search history.

(56) References Cited

U.S. PATENT DOCUMENTS

| | | |
|---|---|---|
| 1,384,659 A | 7/1921 | Bernard |
| 1,399,973 A | 12/1921 | Limpert |
| 1,977,689 A | 10/1934 | Muller |
| 1,990,390 A | 2/1935 | Rudy, Jr. |
| 2,254,961 A | 9/1941 | Harris |
| 2,344,221 A | 3/1944 | Trautner |
| 3,646,338 A | 2/1972 | Goytisolo |
| 3,739,169 A | 6/1973 | Weinreich |
| 3,774,021 A | 11/1973 | Johnson |
| 4,211,955 A | 7/1980 | Ray |
| 4,267,559 A | 5/1981 | Johnson et al. |
| 4,337,759 A | 7/1982 | Popovich et al. |
| 4,371,916 A | 2/1983 | De Martino |
| 4,394,679 A | 7/1983 | Hawrylo |
| 4,729,076 A | 3/1988 | Masami et al. |
| 5,140,220 A | 8/1992 | Hasegawa |
| 5,173,839 A | 12/1992 | Metz, Jr. |
| 5,335,157 A | 8/1994 | Lyons |
| 5,404,869 A | 4/1995 | Parkyn, Jr. et al. |
| 5,452,190 A | 9/1995 | Priesemuth |
| 5,528,474 A | 6/1996 | Roney et al. |
| 5,577,492 A | 11/1996 | Parkyn, Jr. et al. |
| 5,608,290 A | 3/1997 | Hutchisson et al. |
| 5,613,769 A | 3/1997 | Parkyn, Jr. et al. |
| 5,632,551 A | 5/1997 | Roney et al. |
| 5,655,830 A | 8/1997 | Ruskouski |
| 5,676,453 A | 10/1997 | Parkyn, Jr. et al. |
| 5,782,555 A | 7/1998 | Hochstein |
| 5,785,418 A | 7/1998 | Hochstein |
| 5,806,955 A | 9/1998 | Parkyn, Jr. et al. |
| 5,857,767 A | 1/1999 | Hochstein |
| 5,865,529 A | 2/1999 | Yan |
| 5,894,195 A | 4/1999 | McDermott |
| 5,894,196 A | 4/1999 | McDermott |
| 5,897,201 A | 4/1999 | Simon |

(Continued)

*Primary Examiner* — Karabi Guharay
*Assistant Examiner* — Michael Santonocito
(74) *Attorney, Agent, or Firm* — San Diego IP Law Group LLP (57) ABSTRACT

This light emitting diode (LED) device provides a 360 degree lighting angle in the horizontal plane and a 300 degree lighting angle in the vertical plane while simultaneously addressing LED die thermal management, which is critical to high lumen output LEDs. This LED lighting device is comprised of the LED lens, the LED holder and the heat sink stem. Light produced by at least one LED die traveling vertically is diffused by the top refractive portion of the lens. Light rays directed towards the pointed elements are totally internally reflected downwards then refracted out of the lens, thus resulting in a spherical light pattern. This technology is designed as a replacement for conventional light sources, such as incandescent light bulbs, halogen bulbs, CFLs (compact fluorescent lamps) and metal halide lamps.

13 Claims, 10 Drawing Sheets

U.S. PATENT DOCUMENTS

| | | | |
|---|---|---|---|
| 5,898,267 A | 4/1999 | McDermott | |
| 5,924,788 A | 7/1999 | Parkyn, Jr. | |
| 6,045,240 A | 4/2000 | Hochstein | |
| 6,048,083 A | 4/2000 | McDermott | |
| 6,220,722 B1 | 4/2001 | Begemann | |
| 6,238,599 B1 | 5/2001 | Gelorme et al. | |
| 6,273,596 B1 | 8/2001 | Parkyn, Jr. | |
| 6,335,548 B1 | 1/2002 | Roberts et al. | |
| 6,350,041 B1 | 2/2002 | Tarsa et al. | |
| 6,488,392 B1 | 12/2002 | Lu | |
| 6,502,964 B1 | 1/2003 | Simon | |
| 6,504,301 B1 | 1/2003 | Lowery | |
| 6,560,038 B1 | 5/2003 | Parkyn, Jr. et al. | |
| 6,598,998 B2 | 7/2003 | West et al. | |
| 6,607,286 B2 | 8/2003 | West et al. | |
| 6,646,813 B2 | 11/2003 | Falicoff | |
| 6,647,199 B1 | 11/2003 | Pelka et al. | |
| 6,679,621 B2 | 1/2004 | West et al. | |
| 6,773,138 B2 | 8/2004 | Coushaine | |
| 6,786,625 B2 | 9/2004 | Wesson | |
| 6,796,698 B2 | 9/2004 | Sommers et al. | |
| 6,803,607 B1 | 10/2004 | Chan et al. | |
| 6,811,277 B2 | 11/2004 | Amano et al. | |
| 6,955,451 B2 | 10/2005 | Coushaine et al. | |
| 6,981,784 B2 | 1/2006 | Dubuc | |
| 7,006,306 B2 | 2/2006 | Falicoff et al. | |
| 7,008,095 B2 | 3/2006 | Coushaine et al. | |
| 7,021,797 B2 | 4/2006 | Minano et al. | |
| 7,059,748 B2 | 6/2006 | Coushaine et al. | |
| 7,075,224 B2 | 7/2006 | Coushaine et al. | |
| 7,078,254 B2 | 7/2006 | Loh | |
| 7,093,958 B2 | 8/2006 | Coushaine et al. | |
| 7,168,839 B2 | 1/2007 | Chinniah et al. | |
| 7,321,161 B2 | 1/2008 | Teixeira et al. | |
| 2003/0235050 A1* | 12/2003 | West et al. | 362/327 |
| 2005/0225988 A1* | 10/2005 | Chaves et al. | 362/332 |
| 2008/0013325 A1* | 1/2008 | Shiau et al. | 362/326 |
| 2010/0195335 A1* | 8/2010 | Allen et al. | 362/309 |

* cited by examiner (Prior Art)

SPHERICAL LIGHT OUTPUT LED LENS AND HEAT SINK STEM SYSTEM

BACKGROUND OF THE INVENTION

1. Field of Invention

This invention relates to light emitting diode (LED) devices and more specifically, to an improved LED lens and heat sink stem for emitting a spherical light pattern and dissipating heat.

2. Description of Related Art

All light sources convert electrical energy into radiant energy and heat in various proportions. Light emitting diode (LED) devices generate little or no IR (infrared) or UV (ultraviolet) light, but convert only 15% to 25% of the electrical power to visible light, the remainder is converted to heat that must be conducted from the LED die to an underlying circuit board, heat sink, etc.

In order to maintain a low junction temperature to keep good performance of an LED, heat generated by the LED must be dissipated. A build up of heat inside the LED device leads to color shift, reduced light output, shortened life and ultimately device failure. In addition, drive current, thermal path and ambient temperature also affects the junction temperature. Furthermore, high-flux LEDs, which are needed for conventional light illumination, require higher drive currents which further increases junction temperature.

Figure 1:
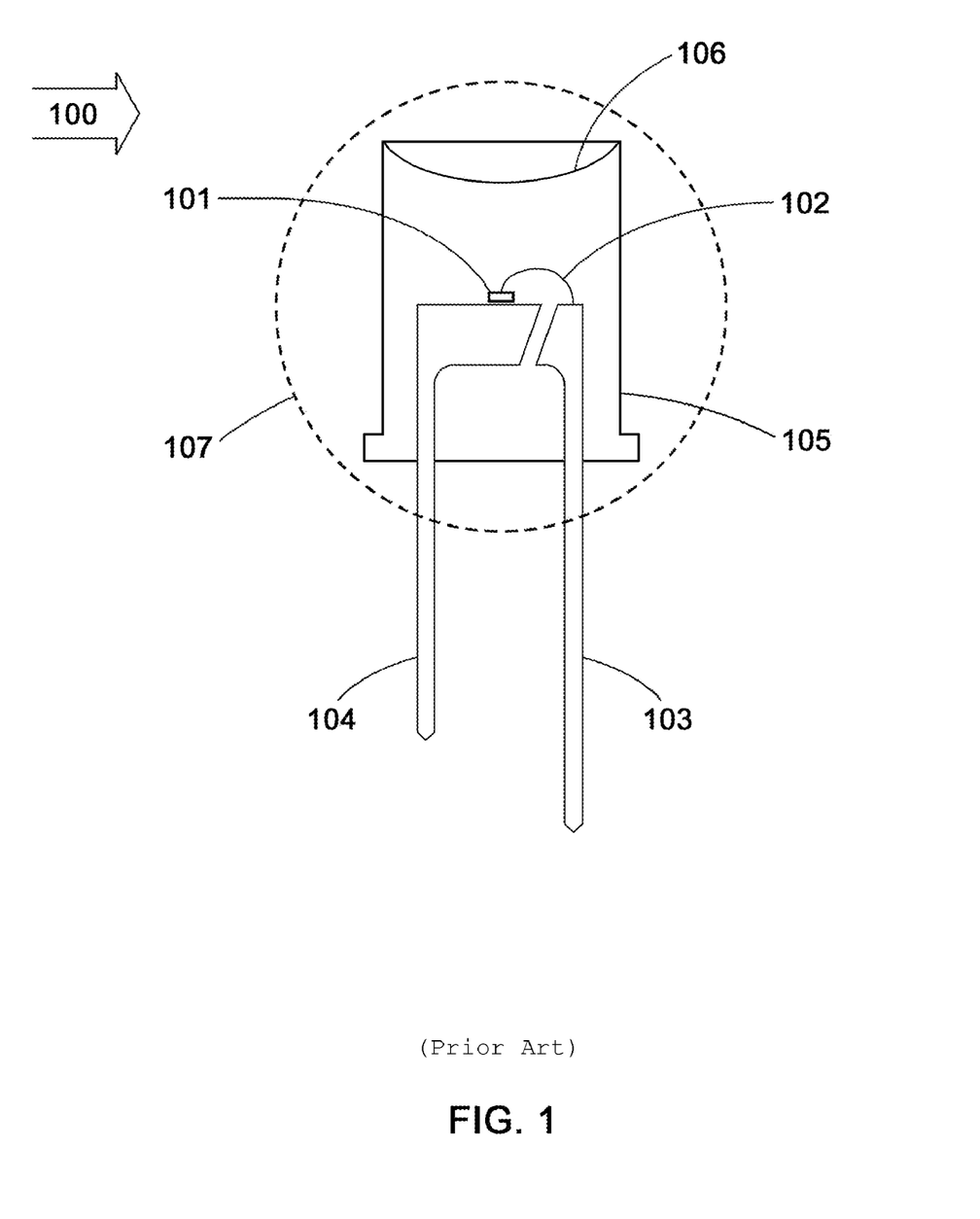
FIG. 1 illustrates a sectional view of a conventional 360 degree lighting angle LED.

FIG. 1 illustrates a sectional view of a conventional 360 degree lighting angle LED 100 having one or more LED dies 101 which sits atop the first electrode 104. A bonding wire 102 connects the LED die 101 to the second electrode 103. Light emitted by the LED die 101 exits the transparent encapsulate 105 in all directions. The upper surface 106 acts as a partial reflector, reflecting some of the light downwards. In another 360 degree LED prior art example, the encapsulate 105, takes the shape of a sphere 107.

If such LED devices are to be used as conventional lighting, then high-flux LEDs must be incorporated. High-flux LEDs produce more heat, and heat must be moved away from the die 101 in order to maintain expected light output, life and color. Unfortunately, the prior art example contains a critical flaw; it neglects to address LED thermal management; as it does not contain any significant heat sink to draw out the heat via conduction. Electrodes 103 and 104 may draw out some heat; though the majority of the heat generated is trapped inside by the insulating plastic resin encapsulate 105 or 107. Such LED lamps are thus relegated for use with only lower flux LEDs, which would not be suitable for conventional lighting needs. Retrofitting this LED lamp with a sufficient heat sink, beneath the LED die 101 would revert the 360 degree lighting angle back to typical 30 to 140 degree lighting angles.

A need therefore exists for an LED device designed to emit a spherical light pattern while successfully managing the heat generated. Such a device would be advantageous for use as a replacement to current conventional light sources or other applications where spherical light patterns are desired.

SUMMARY OF THE INVENTION

This LED lighting device is comprised of an LED lens, an LED holder and a heat sink stem. The crown of the LED lens features twin convex peaks; other iterations may include a convex or concave crown. Circumscribing the lens are 5 pointed, reflective and refractive elements. This LED lens is attachable or fixed to the LED holder. The LED holder houses the LED die, the positive and negative terminals, and the heat sink slug. The holder is attached to the heat sink stem. In the preferred embodiment, the holder and the heat sink stem are one entity. In another embodiment, the LED holder has a hollowed out cylinder base with positive and negative contact patches. In another embodiment, the LED holder has a hollowed out cylinder base with positive and negative contact points. In yet another embodiment, the LED holder has a hollowed out cylinder base with a screw type pattern on the inner walls with positive and negative contact areas.

The LED lens and each of the various embodiments of the LED holder are attached or fixed atop their individually related heat sink stem. The heat sink stem performs the critical task of drawing heat out of the device. The stem is also used as a means of conveying power to and from the LED Device. Finally, the stem provides an elevated and unobstructed platform for light propagation.

Light produced by an LED die is diffused upwards and outwards by the top refractive crown portion of the lens. Light rays directed towards the pointed elements are totally internally reflected downwards then refracted out of the lens. The result is a spherical light pattern. Heat produced by the LED die is conducted by the Heat sink slug and is then absorbed by the heat sink stem via an intermediate thermal material.

The foregoing, and other features and advantages of the invention, will be apparent from the following, more particular description of the preferred embodiments of the invention, the accompanying drawings, and the claims.

BRIEF DESCRIPTION OF THE DRAWINGS

For a more complete understanding of the present invention, the objects and advantages thereof, reference is now made to the ensuing descriptions taken in connection with the accompanying drawings briefly described as follows.

DETAILED DESCRIPTION OF EMBODIMENTS

Further features and advantages of the invention, as well as the structure and operation of various embodiments of the invention, are described in detail below with reference to the accompanying FIGS. 2-11.

Figure 2:
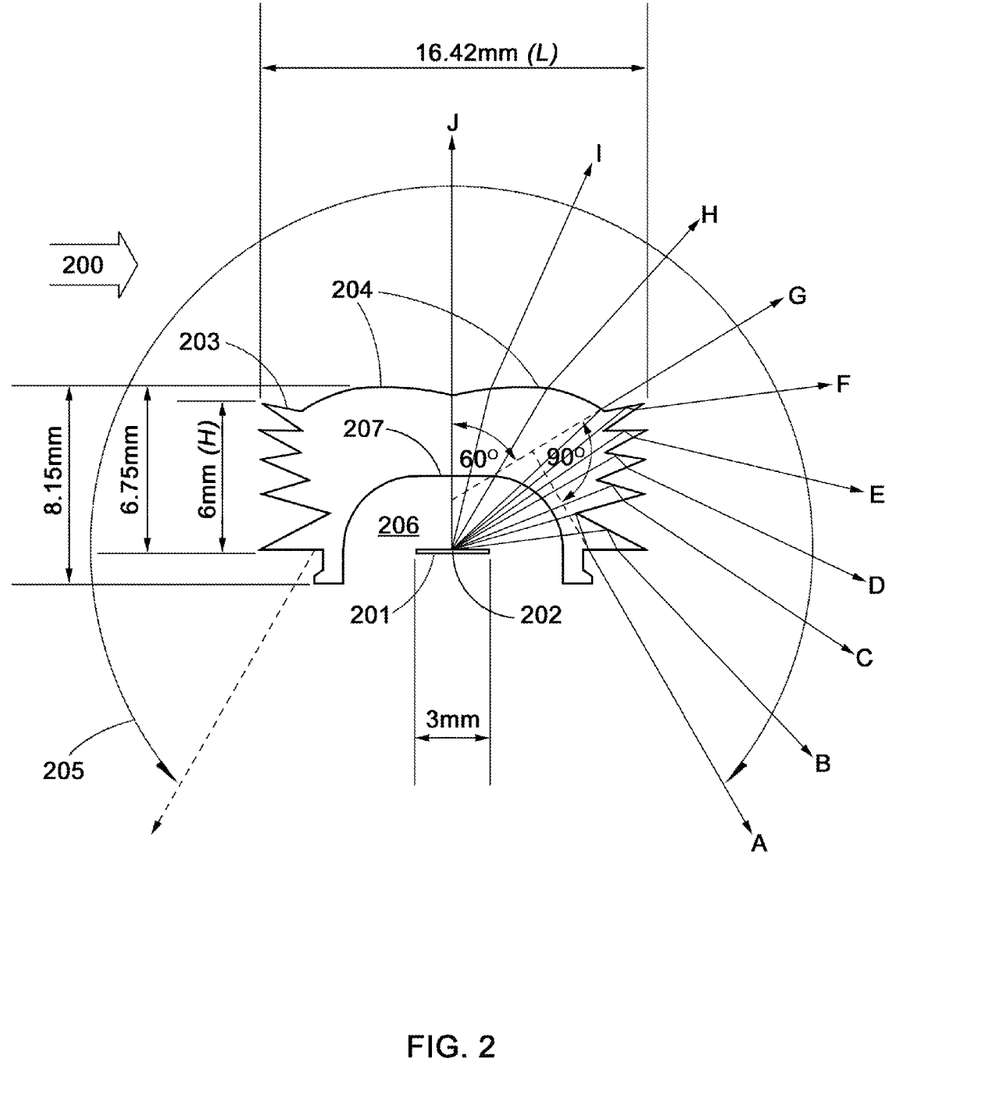
FIG. 2 illustrates an example of a spherical light producing lens in accordance with one embodiment of the invention.

FIG. 2 illustrates an example of a spherical light producing lens in accordance with one embodiment of the invention. Light rays A through G emanating from an LED die 201, with a focal point 202, are totally internally reflected then refracted out of the lens 200 by the pointed elements 203 through a 90 degree angle. The top surface of the pointed elements 203 may be coated with a reflective material such as aluminum (AL) or nickel chrome (NiCr). Light rays G through J are refracted out of the double crown lens portion 204 through a 60 degree angle. Collectively, all the light rays emitted by the LED die 201 radiate around a 300 degree lighting angle 205 in the vertical plane and a 360 degree lighting angle in the horizontal plane. Surface 207 may be shaped to direct more light rays emitted from the LED die 201 towards a particular section of the lens, such as the pointed elements 203.

The length of the die 201 is directly proportional to the size of the lens 200. The lens length (L) is 5.472 times the die length, whereas the lens height (H) is 2 times the die length. Thus, the lens 200 size may be scaled up or down in proportion to the die length 201.

The lens 200 may be manufactured by a variety of process including but not limited to injection molding, casting and diamond etching. The lens 200 is made of a transparent material including but not limited to acrylic; also known as Polymethylmethacrylate (PMMA), polycarbonate (PC), polyetherimide (PEI) and cyclic olefin copolymer (COC). The optimal refractive index range of the lens 200 is between 1.4 and 1.6.

The volume 206 between the lens and the LED die 201 may be used to house a lens (not shown) mounted to the LED die 201 and employed to direct more light emitted from the LED die 201 towards a particular section of the lens, such as the pointed elements 203. This volume 206 may also be filled with a transparent material including but not limited to silicone, epoxy or any other material with a refractive index of 1.4-1.6.

The lens 200 may also act as a color filter.

Figure 3:
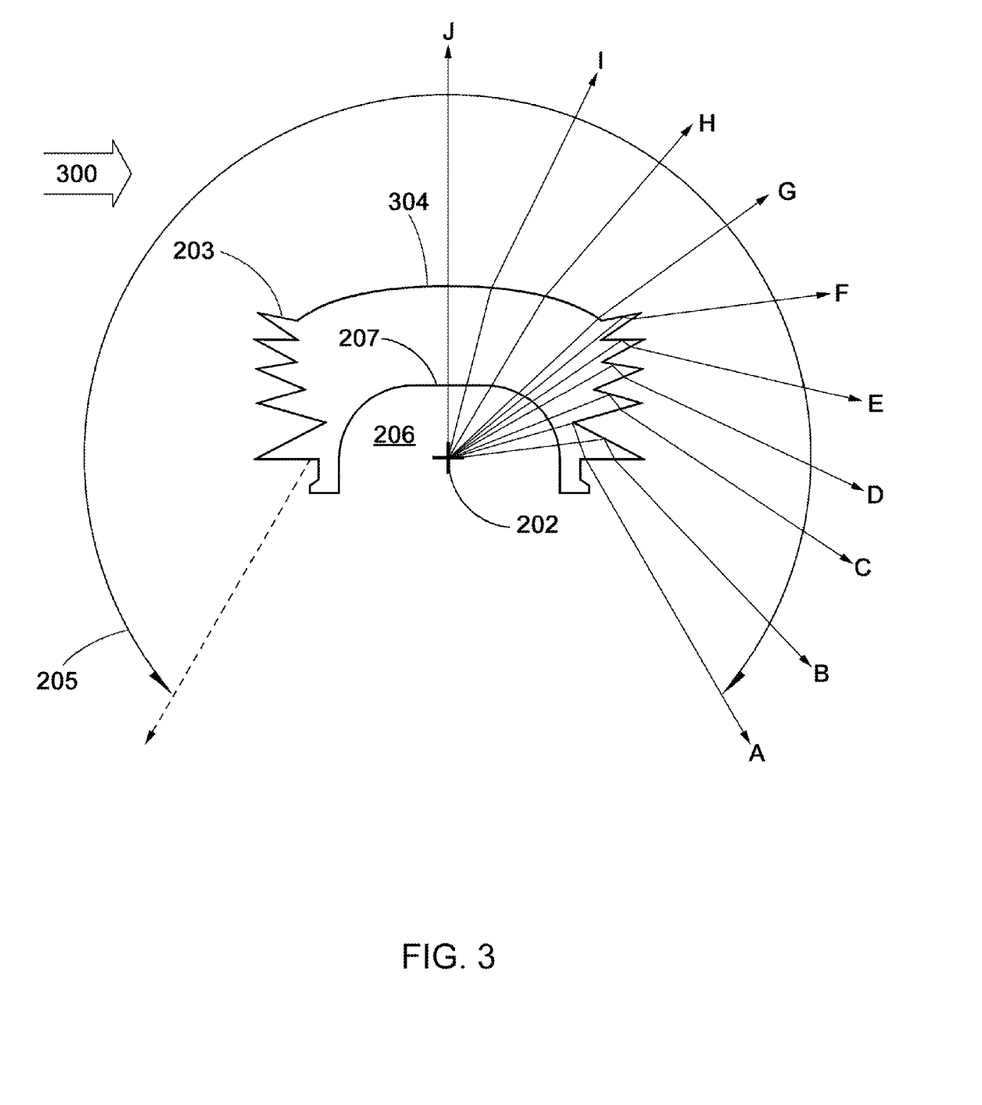
FIG. 3 is another iteration of the lens featuring a convex crown.

FIG. 3 illustrates another iteration of the lens 300 which features a convex crown 304.

Figure 4:
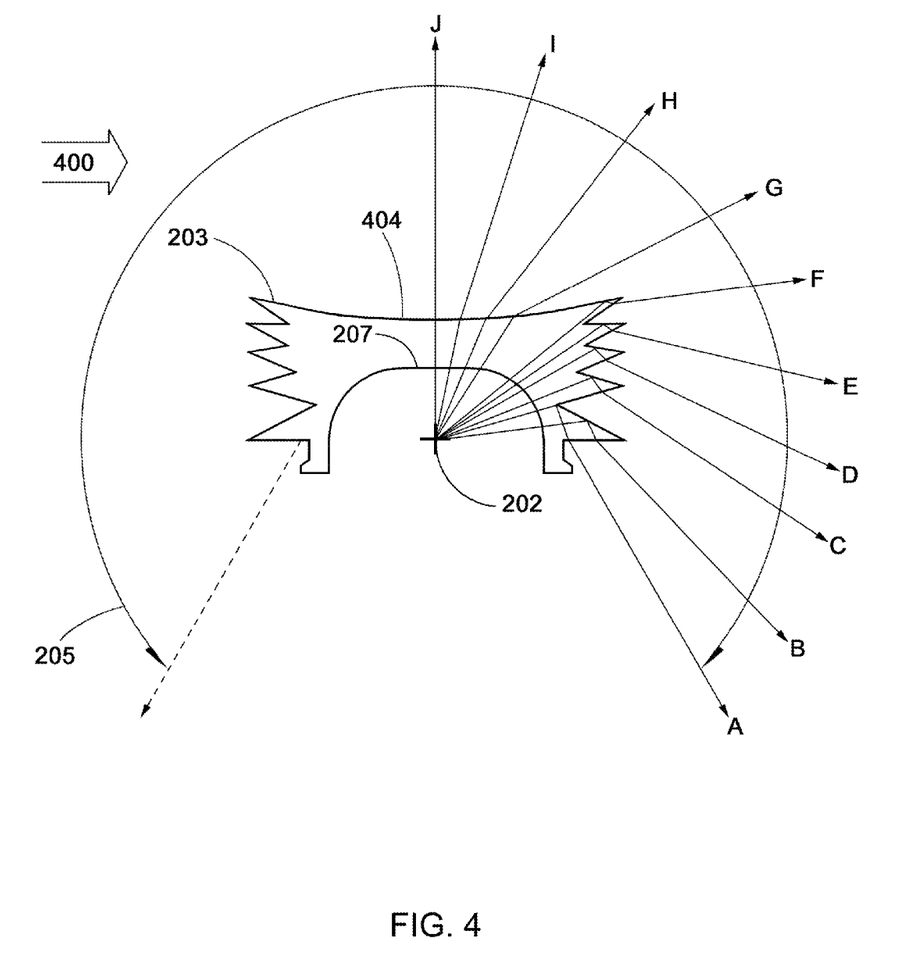
FIG. 4 is another iteration of the lens featuring a convex crown.

FIG. 4 illustrates a version of the lens 400 featuring a concave crown 404.

Figure 5:
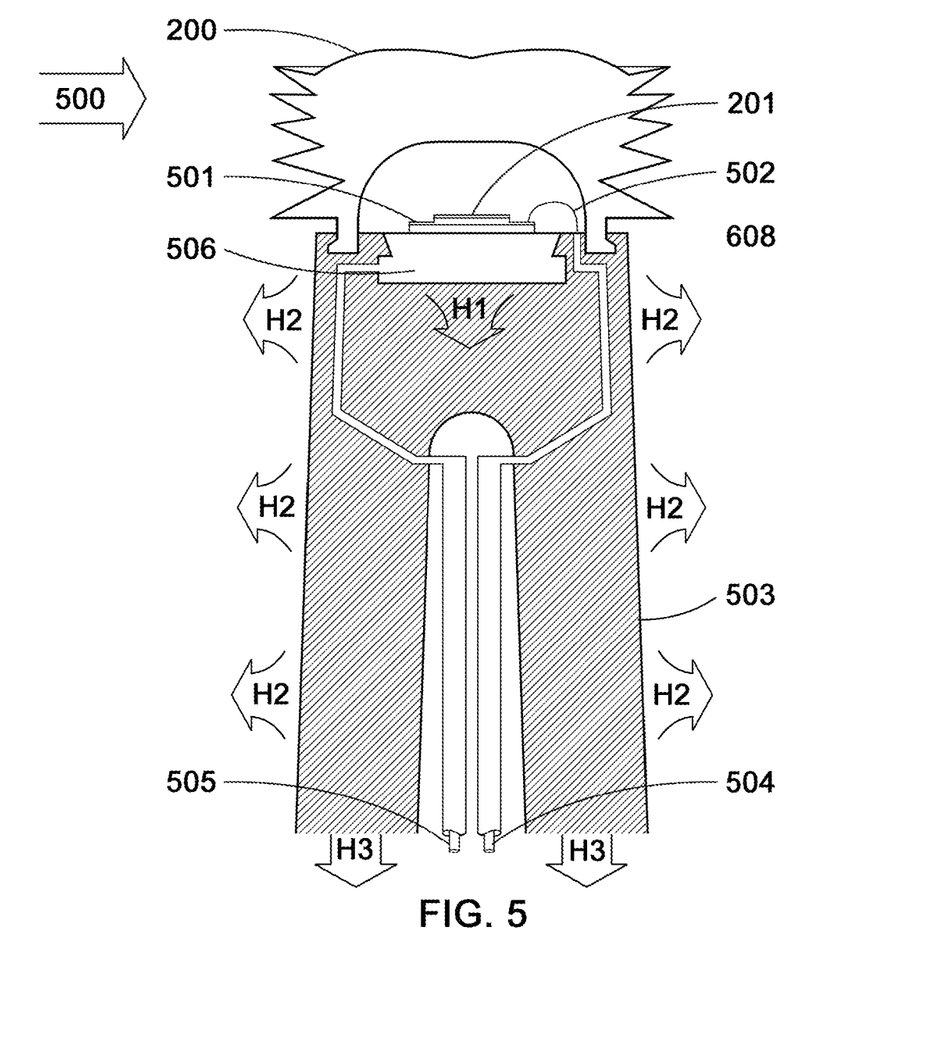
FIG. 5 is an iteration of the lens shown in FIG. 2 attached to its corresponding heat sink structure.

FIG. 5 illustrates a sectional view of an LED device 500 where a lens 200 may be attached, fused or bonded to the top of the heat sink stem 503. The LED die 201 is mounted on a silicon substrate 501 (though other substrates may also be used). Electricity powers the device by traveling from the positive lead 504 through the heat sink stem 503, across the bond wire 502 to the LED chip 201. The negative lead 505 emerges from the heat sink slug 506. Besides the light that is produced (the propagation of which is described in FIGS. 2-4) a significant amount of heat is also generated by the LED die 201. Heat H1 is initially absorbed by the heat sink slug 506 and then transferred to the heat sink stem 503. The heat sink stem radiates heat away from the outer stem walls by convection H2 and conducts the remainder of the heat H3 to a prospective device. The heat sink stem 503, which can vary in length and width, may be made of a non-electrically conductive plastic material. This high thermal conductive plastic may be injection molded. Another iteration of the heat sink stem is made of metal.

Figure 6A:
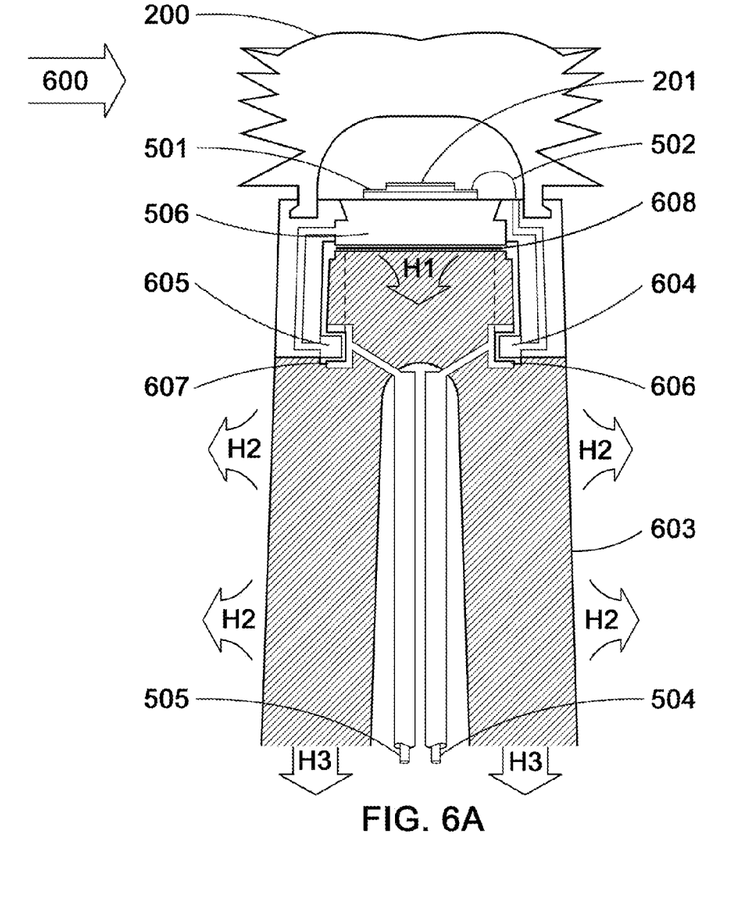
FIG. 6A is a sectional view of the lens shown in FIG. 2, featuring contact points and heat sink stem.
Figure 6B:
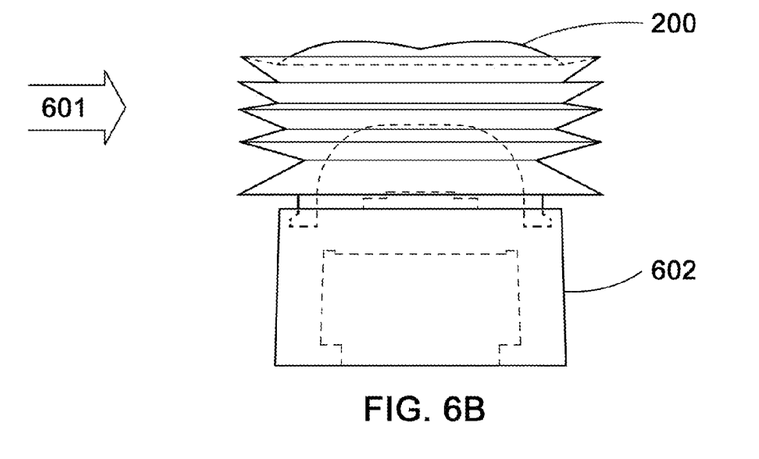
FIG. 6B is an iteration of the lens shown in FIG. 2, forming a lens, LED and holder attachment with contact points.

FIG. 6B illustrates a lens 200 and LED lens holder 602 which jointly form the lens and holder attachment 601.

FIG. 6A shows a sectional view of an LED device 600 which illustrates the means by which the lens and holder attachment 601 is joined to the heat sink stem 603. The lens and holder attachment 601 is attached by means of two contact points 604 and 605. The lens and holder attachment 601 is mounted atop the heat sink stem 603 and then rotated through a clockwise or a counterclockwise rotation (depending on the design) until the positive contact point 604 and negative contact point 605 are locked into the positive contact terminal 606 and negative contact terminal 607 respectively. A thermal interface material 608 reduces the thermal resistance and increases the heat flow between the two bordering surfaces; the heat sink slug 506 and the heat sink stem 603. The thermal interface material 608 may include; thermally conductive paste, thermally conductive compounds, Phase change material, thermally conductive elastomers and thermally conductive tape.

Figure 7A:
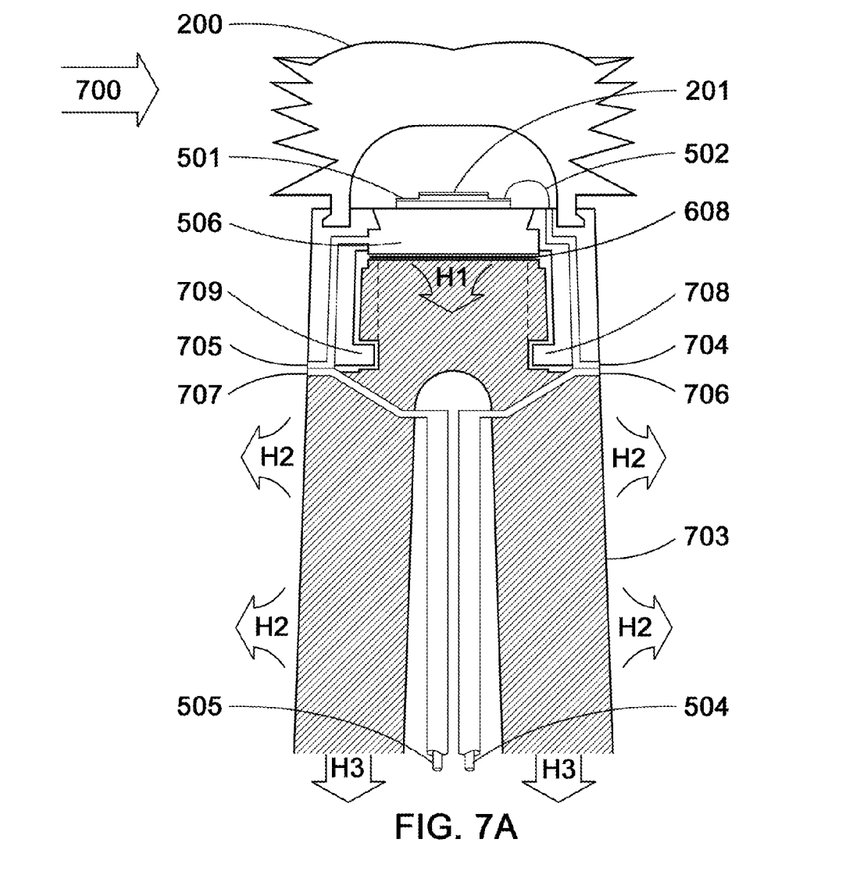
FIG. 7A is a sectional view of the lens shown in FIG. 2, featuring contact patches.
Figure 7B:
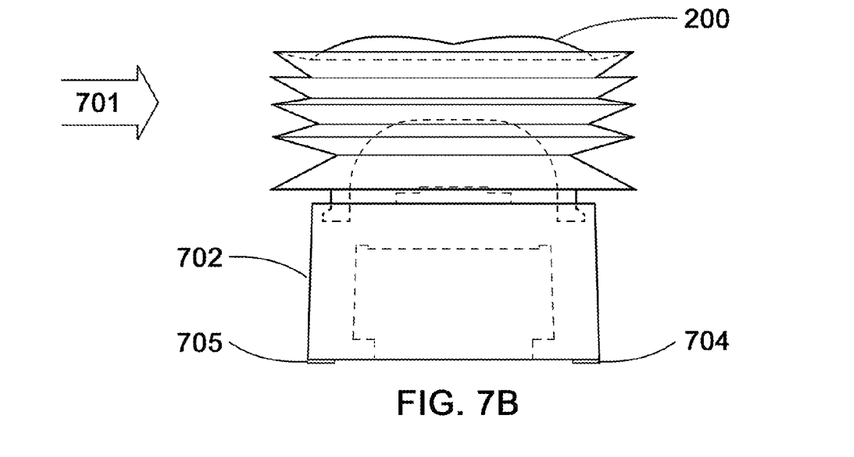
FIG. 7B is an iteration of the lens shown in FIG. 2, forming a lens, LED and holder attachment with contact patches.

FIG. 7B illustrates a lens 200 and LED lens holder 702 which jointly form the lens and holder attachment 701. A positive 704 and a negative contact patch 705 protrude from the base of the attachment 701.

FIG. 7A shows a sectional view of an LED device 700 which illustrates the means by which the lens and holder attachment 701 is joined to the heat sink stem 703. The lens and holder attachment 701 is attached by means of two contact points 708 and 709. The lens and holder attachment 701 is mounted atop the heat sink stem 703 and then rotated through a clockwise or a counterclockwise rotation (depending on the design) until the positive contact patch 704 and negative contact patch 705 are locked onto the positive contact terminal 706 and negative contact terminal 707 respectively. A thermal interface material 608 may be used as a heat conduit between the heat sink stem 703 and the heat sink slug 506.

Figure 8A:
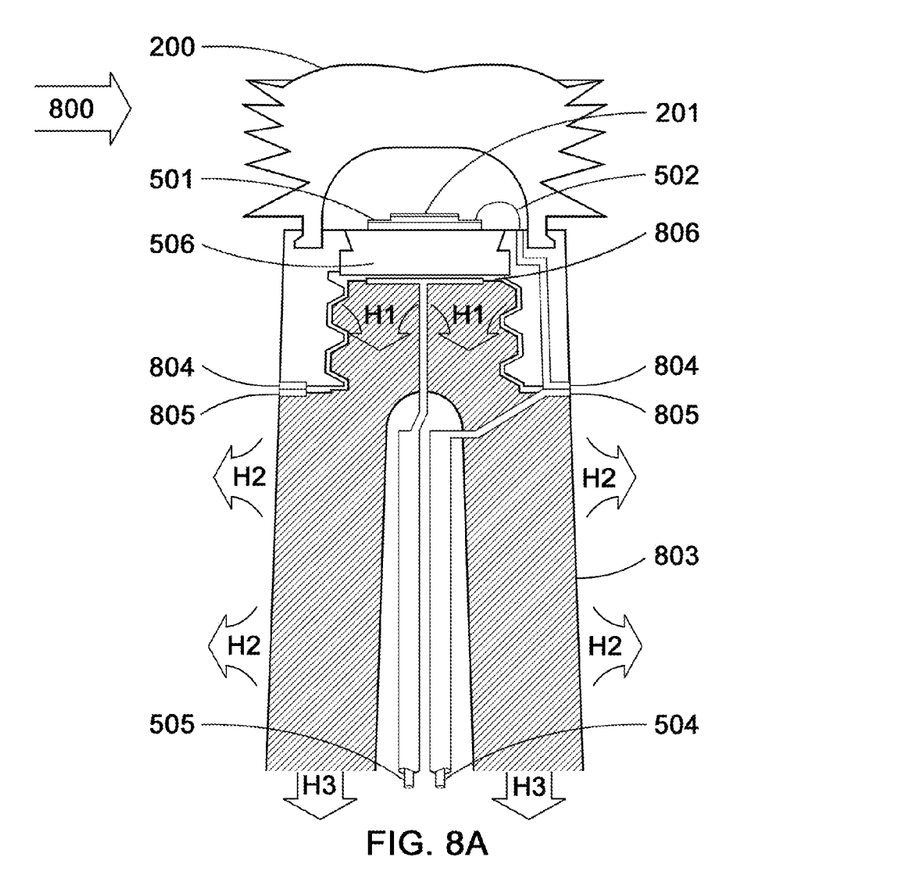
FIG. 8A is a sectional view of the lens in FIG. 2, featuring a screw connection and heat sink stem with a screw connection.
Figure 8B:
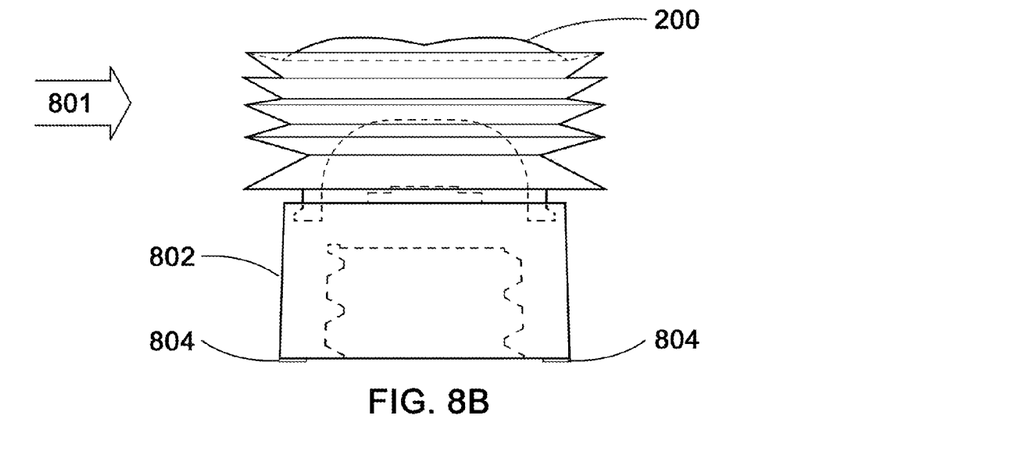
FIG. 8B is an iteration of the lens shown in FIG. 2, forming a lens, LED and holder attachment with a screw connection.

FIG. 8B illustrates a lens 200 and LED lens holder 802 which jointly form the lens and holder attachment 801. A positive contact patch 804 circumscribes the base of the attachment 801.

FIG. 8A shows a sectional view of an LED device 800 which illustrates the means by which the lens and holder attachment 801 is joined to the heat sink stem 803. The lens and holder attachment 801 is attached by a screw connection. The lens and holder attachment 801 is mounted atop the heat sink stem 803 and rotated through a clockwise or a counterclockwise rotation (depending on the design) until the positive contact patch 804 and the heat sink slug 506 are tightened and may be locked onto the positive contact terminal 805 and the negative center pad 806 respectively.

An electrically conductive, thermal interface material may be used as an interface between the negative center pad 806 and the heat sink slug 506.

Figure 9A:
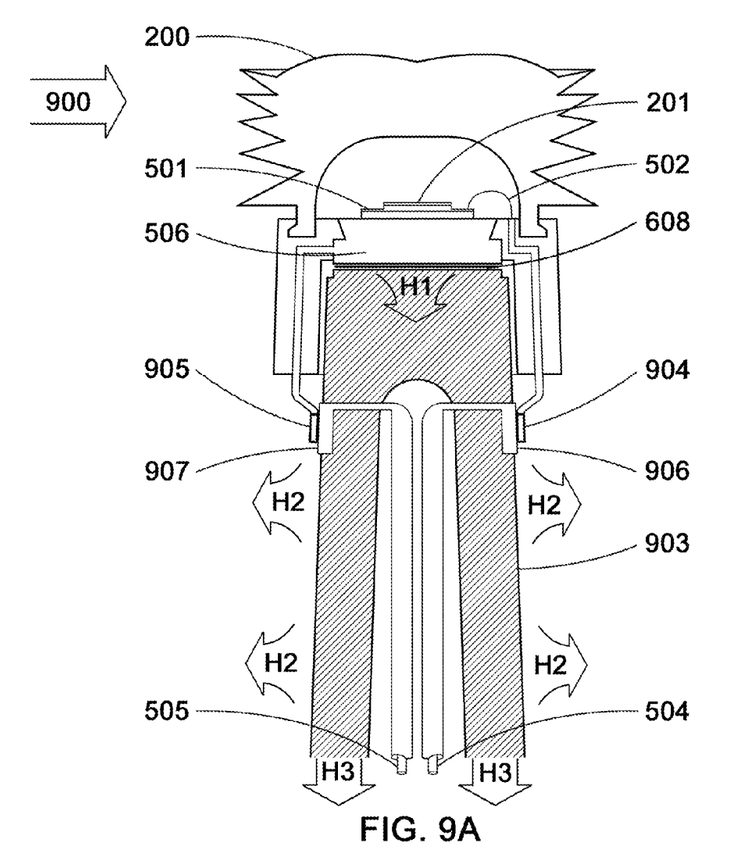
FIG. 9A is a sectional view of the lens shown in FIG. 2, featuring positive and negative leads and heat sink stem with positive and negative contact pads.
Figure 9B:
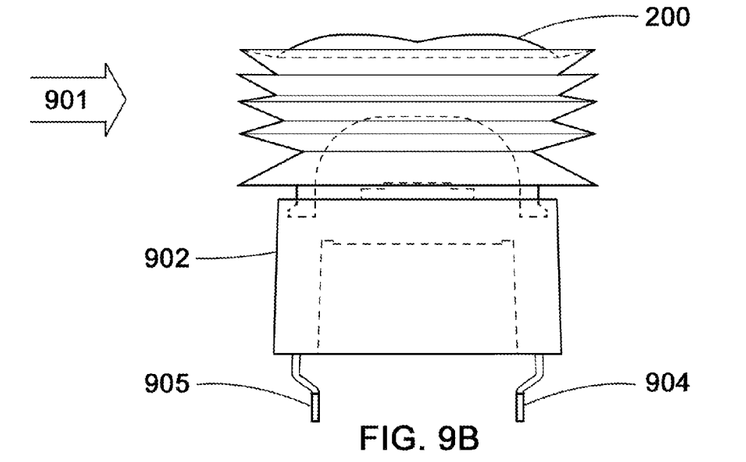
FIG. 9B is an iteration of the lens shown in FIG. 2, forming a lens, LED and holder attachment with positive and negative leads.

FIG. 9B illustrates a lens 200 and LED lens holder 902 which jointly form the lens and holder attachment 901. A positive 904 and a negative lead 905 extend out from the base of the attachment 901.

FIG. 9A shows a sectional view of an LED device 900 which illustrates the means by which the lens and holder attachment 901 is joined to the heat sink stem 903. The positive LED lead 904 and the negative LED lead 905 are soldered to the positive solder pad 906 and the negative solder pad 907 respectively. A thermal interface material 608 may be used as a heat conduit between the heat sink stem 903 and the heat sink slug 506.

Figure 10:
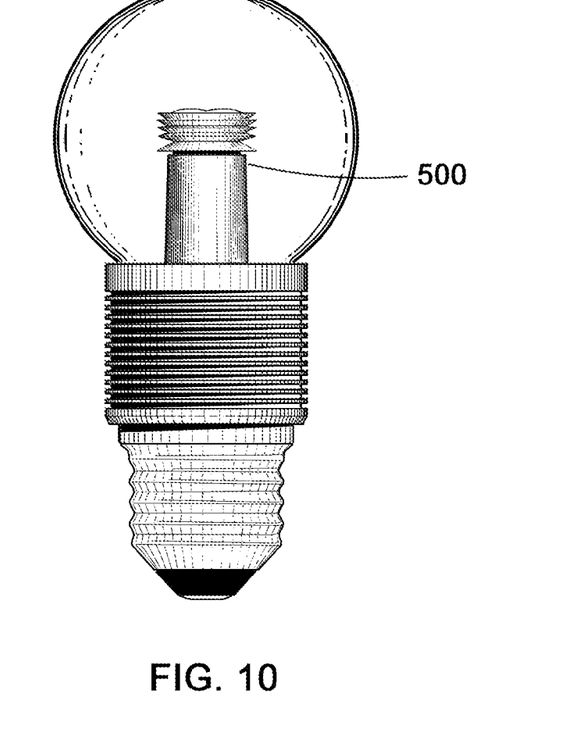
FIG. 10 features an LED device package of FIG. 5 adopted for use in a conventional incandescent Edison bulb package.

FIG. 10 illustrates one variation of the LED device 500 adopted for use in a conventional incandescent Edison bulb package. LED device packages 600 through 900 may also be used.

Figure 11:
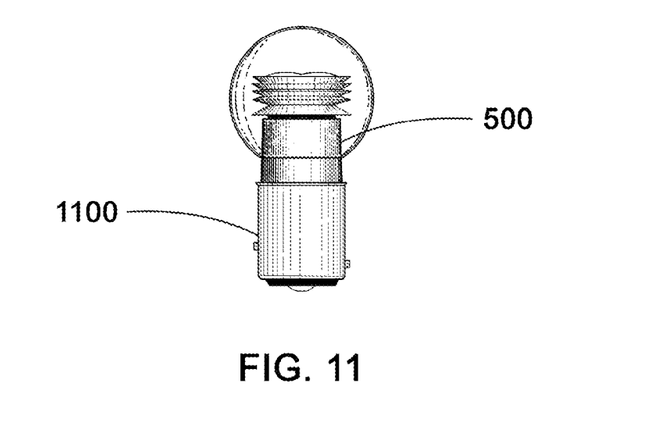
FIG. 11 features an LED device package of FIG. 5 adopted for use in a conventional incandescent bulb with an indexed double contact bayonet style base.

FIG. 11 illustrates another variation of the LED device 500 adopted for use in a conventional incandescent bulb with an indexed double contact bayonet style base. LED device packages 600 through 900 may also be used.

The above described embodiments of the present invention are meant to be illustrative and not limiting. It will thus be obvious to those skilled in the art that various changes and modifications may be made without departing from this invention in its broader aspects. Therefore, the appended claims encompass all such changes and modifications as falling within the spirit and scope of this invention.

What is claimed is:

1. A lens attachable to a light emitting diode (LED) light source, the lens comprising:
    a body having a crown, a base, and a generally cylindrical surface located between the crown and the base;
    five (5) pointed, reflective and refractive elements located on the generally cylindrical surface, which totally internally reflect light and then refract light emitted from the LED light source such that the majority of the light rays emitted from the lens is radiated around a 300 degree angle in the vertical plane and 360 degrees in the horizontal plane, wherein the five pointed, reflective and refractive elements abut one another on the generally cylindrical surface; and
    an internal surface within the lens roughly parallel to an LED light source which acts as a lens, directing more light towards the pointed elements or towards the crown of the lens.

2. The lens of claim 1, wherein a top portion of each of the pointed elements is coated with a reflective material.

3. The lens of claim 1, wherein the lens is made of a transparent material selected from the group consisting of polymethylmethacrylate (PMMA), polycarbonate (PC), polyetherimide (PEI), cyclic olefin copolymer (COC), and a combination thereof.

4. The lens of claim 1, wherein the lens has a refractive index of 1.4 to 1.6.

5. The lens of claim 1, wherein the base is shaped to couple the base to a LED light source and a LED holder, or a heat sink stem.

6. The lens of claim 5, wherein the base is attached to the LED light source and the LED holder, or the heat sink stem via an optical adhesive.

7. The lens of claim 5, wherein the base is attached to the LED light source with an air gap located between the lens and the LED holder, or the heat sink stem.

8. The lens of claim 5, wherein the base is attached to the LED light source with a refractive index matched material located between the lens and the LED holder, or the heat sink stem.

9. The lens of claim 1, wherein the lens is attached to an LED holder or heat sink stem containing an LED light source with an LED die mounted lens located between the lens and LED holder or heat sink stem.

10. The lens of claim 1, wherein a diameter of the generally cylindrical surface is at least two times greater than a length of the LED.

11. The lens of claim 1, wherein a height of the lens is between two and five times greater than a length of the LED.

12. The lens of claim 1, wherein the crown has a convex shape.

13. The lens of claim 1, wherein the crown has a concave shape.

* * * * *